United States Patent
Gunji

(10) Patent No.: US 8,419,856 B2
(45) Date of Patent: Apr. 16, 2013

(54) SUBSTRATE PROCESSING APPARATUS

(75) Inventor: Isao Gunji, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/547,689

(22) Filed: Jul. 12, 2012

(65) Prior Publication Data
US 2012/0279452 A1 Nov. 8, 2012

Related U.S. Application Data

(63) Continuation of application No. PCT/JP2011/050425, filed on Jan. 13, 2011.

(30) Foreign Application Priority Data

Jan. 14, 2010 (JP) ................................ 2010-006270

(51) Int. Cl.
*C23C 16/00* (2006.01)
*C30B 23/00* (2006.01)
*C30B 25/00* (2006.01)
*C30B 28/12* (2006.01)
*C30B 28/14* (2006.01)

(52) U.S. Cl.
USPC .............................. 118/715; 118/722; 117/90

(58) Field of Classification Search .................. 118/715, 118/722; 117/90
See application file for complete search history.

(56) References Cited

U.S. PATENT DOCUMENTS

| 5,447,693 A * | 9/1995 | Ohta et al. ..................... 422/122 |
| 7,211,152 B2 | 5/2007 | Ishibashi et al. |
| 2002/0114949 A1* | 8/2002 | Bower et al. ................... 428/401 |
| 2005/0188617 A1 | 9/2005 | Ogura et al. |
| 2005/0221002 A1* | 10/2005 | Nakamura et al. .......... 427/248.1 |
| 2007/0178022 A1* | 8/2007 | Bauman et al. ............... 422/130 |

FOREIGN PATENT DOCUMENTS

| JP | 6-031178 | 2/1994 |
| JP | 8-250438 | 9/1996 |
| JP | 9-032536 | 2/1997 |
| JP | 9-106883 | 4/1997 |
| JP | 11-067727 | 3/1999 |
| JP | 2001-358077 | 12/2001 |
| JP | 2005-238099 | 9/2005 |
| JP | 2006-135349 | 5/2006 |

OTHER PUBLICATIONS

International Search Report issued on Feb. 15, 2011 for PCT/JP2011/050425 filed on Jan. 13, 2011 with English Translation.

* cited by examiner

*Primary Examiner* — Keath Chen
(74) *Attorney, Agent, or Firm* — Oblon, Spivak, McClelland, Maier & Neustadt, L.L.P.

(57) ABSTRACT

Disclosed is a substrate processing apparatus in which a plurality of rod-like ceramic heaters are arranged in the form of islands and affixed to the top plate of a process chamber so as to face a wafer, and the lower end portion of each ceramic heater is provided with a metal catalyst layer in such a manner that the metal catalyst layer faces a gas discharge hole of a gas diffusion plate. Consequently, the metal catalyst layer is indirectly heated by the ceramic heater (a resistance heating wire), thereby activating a processing gas.

9 Claims, 10 Drawing Sheets

SUBSTRATE PROCESSING APPARATUS

This application is a Continuation Application of PCT International Application No. PCT/JP2011/050425 filed on Jan. 13 2011, which designated the United States.

FIELD OF THE INVENTION

The present invention relates to a substrate processing apparatus for processing a substrate by using active species.

BACKGROUND OF THE INVENTION

In a semiconductor device manufacturing process, there is known a Hot-wired CVD (Chemical Vapor Deposition) method or a Cat (catalyst)—CVD method for forming a film, e.g., a W (tungsten) film or a poly-crystalline Si (silicon) film for solar cell or the like, on a substrate, e.g., a semiconductor wafer (hereinafter, referred to as 'wafer'), by using active species such as ions or radicals activated by a catalyst.

In such CVD method, a catalyst formed of a refractory metal, e.g., W (tungsten), Ir (iridium), Pt (platinum), Mo (molybdenum), Ru (ruthenium), Pd (palladium), Co (cobalt), Ni (nickel) or the like, is heated to, e.g., about 1000° C. or above. Then, film forming species activated by bringing a processing gas containing $H_2$ (hydrogen) gas, $NH_3$ (ammonia) gas or the like, e.g., $SiH_4$ (silane) gas, into contact with the catalyst are supplied to the wafer. As a result, a poly-crystalline Si film, for example, is formed.

As an example of a specific configuration of the CVD apparatus using such catalyst, there is known, e.g., a configuration in which a mounting table for mounting thereon a wafer and a bellows-shaped or net-shaped wire made of a catalyst metal are provided in a processing chamber. The wire is disposed at an area close to the wafer mounted on the mounting table, e.g. hung from the ceiling wall of the processing chamber, so as to face the wafer.

In this configuration, the wire is heated by power supplied thereto, and a processing gas is supplied to the wafer via the area in which the wire is provided. Herein, the film forming species activated by the catalyst are deactivated after a lapse of time (after moving a distance).

For that reason, the wire is disposed near the mounting table so that the area where the film forming species are activated is positioned close to the wafer mounted on the mounting table.

Meanwhile, in the case of using the wire made of a catalyst metal, the following problems are generated. In other words, the catalyst metal line (wire) is directly heated by power supplied thereto, so that the wire may be disconnected if the catalyst is oxidized by the processing gas, for example. If the wire once is disconnected, it is difficult to reconnect the wire. For example, the wire needs to be replaced as a whole, and this leads to increase of a cost. Further, since the catalyst is disposed close to the wafer on the mounting table, the wire may be bent by heating and may be brought into contact with the wafer.

In order to prevent the catalyst from being short-circuited during the film forming process, the catalyst needs to be electrically insulated from the wafer or the processing chamber. At the same time, the vacuum atmosphere in the processing chamber should be maintained. Thus, the wire needs to be airtightly maintained while being hung inside the processing chamber. In other words, the freedom of installation of the catalyst is decreased, and the effective area of the catalyst is limited. Moreover, since the catalyst material is machined into a wire, fabrication cost increases compared to the case of using a bulk material.

Japanese Patent Publication Application No. 2001-358077 discloses a film forming apparatus using a plate-shaped catalyst. However, it is difficult to uniformly heat the plate while preventing the plate from being broken at a high temperature. It is further difficult to sustain the high-temperature plate while preventing the high-temperature plate from being short-circuited with respect to the wafer or the processing chamber.

Furthermore, when the plate is disposed to face the wafer, it is difficult to uniformly supply a processing gas or active species to the wafer. Although Japanese Patent Application Publications Nos. H9-106883, 2005-238099, H6-31178, H9-32536, H11-67727, H8-250438, and 2006-135349 disclose the prior arts related to the present invention, the aforementioned drawbacks are not considered at all.

SUMMARY OF THE INVENTION

In view of the above, the present invention provides a substrate processing apparatus which processes a substrate using active species generated from a processing gas activated by a heated catalyst, being capable of preventing a power feeding portion for heating from being disconnected or short-circuited, the power feeding portion being supplied with power.

In accordance with an aspect of the present invention, there is provided a substrate processing apparatus for processing a substrate using active species obtained by activating a processing gas, the apparatus including: a processing chamber, having therein a mounting unit for mounting thereon a substrate, for forming a processing space; a gas supply unit which supplies a processing gas into the processing chamber; and a heating structure including a ceramic body disposed in the processing chamber and a resistance heating element disposed in the ceramic body, the ceramic body having a surface to which a catalyst for activating the processing gas is affixed.

The heating structure may have a rod shape and a leading end portion thereof which faces the processing space serves as a heating unit for generating heat to a temperature effective for activating the processing gas.

It is preferred that a plurality of the heating units are arranged in an island shape when seen from the substrate mounted on the mounting unit.

The substrate processing apparatus may further includes: a gas diffusion plate having a plurality of gas through holes, which faces the substrate and partitions the gas supply unit and the processing space in which the substrate is mounted, wherein the heating units may be arranged to face the gas through holes or positioned inside the gas through holes.

Preferably, the heating structure penetrates the processing chamber from outside, and a penetrating portion is airtightly sealed. Alternatively, the heating structure may extend vertically and penetrates through a ceiling portion of the processing chamber. Furthermore, the heating structure may extend horizontally and penetrates through the processing chamber.

The substrate processing apparatus may further include a moving unit which moves the mounting unit horizontally to compensate non-uniform supply of active species to a substrate surface which is caused by the arrangement of the heating units.

Further, the substrate processing apparatus may include: a gas diffusion plate having a plurality of gas through holes, which faces the substrate and partitions the gas supply unit and the processing space in which the substrate is mounted, the heating structure forming at least a part of the gas diffusion plate. In the heating structure, a heating unit which generates heat to a temperature effective for activating a processing gas may include a portion surrounding the gas through holes of the gas diffusion plate.

With the present invention, in an apparatus which processes a substrate using active species obtained by activating a processing gas by a heated catalyst, there is employed a heating structure in which a catalyst is affixed to a surface of a ceramic body having a resistance heating element formed therein. Thus, the catalyst is indirectly heated via the ceramic body, instead of heating the catalyst metal wire by supplying a current thereto. Therefore, the power feeding portion for heating is not disconnected or short-circuited by deterioration due to the use environment.

DETAILED DESCRIPTION OF THE EMBODIMENTS

Figure 1:
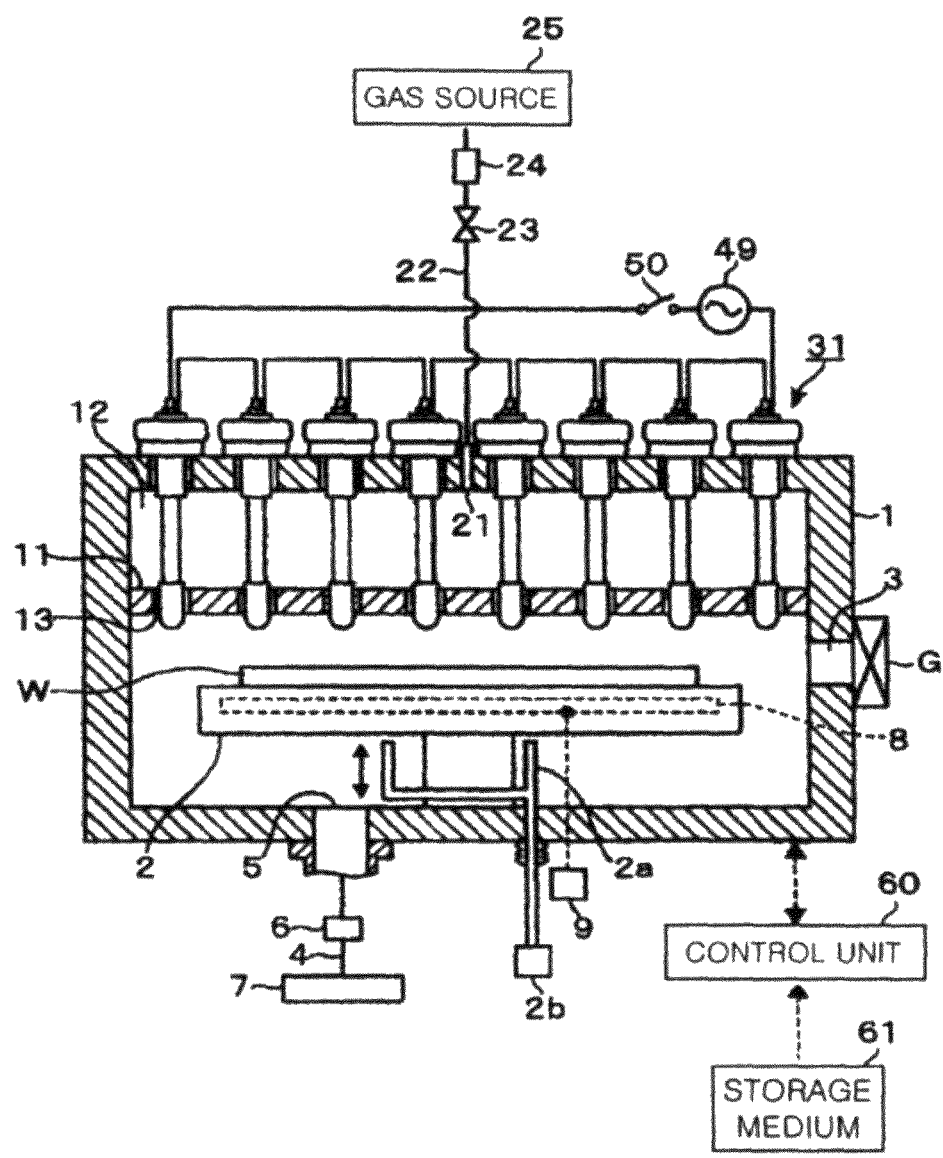
FIG. 1 is a vertical cross sectional view showing a substrate processing apparatus in accordance with an embodiment of the present invention.

An example in which a substrate processing apparatus in accordance with an embodiment of the present invention is applied to a film forming apparatus will be described with reference to FIGS. 1 to 3. The film forming apparatus includes: a processing chamber 1; a mounting table 2 provided in the processing chamber 1, for mounting thereon a substrate, e.g., a semiconductor wafer (hereinafter, referred to as 'wafer'); and a processing gas supply line 22 for supplying a processing gas to be described later into the processing chamber from a processing gas supply port 21 provided at a central portion of, e.g., a ceiling surface of the processing chamber 1.

The processing gas supply line 22 is connected via a valve 23 and a flow rate controller 24 to a gas source 25 of a processing gas, e.g., silane ($SiH_4$) gas, for generating active species of H (hydrogen) and film forming species, e.g., Si (silicon). In this example, a portion extending from the gas source 25 to the processing gas supply port 21 corresponds to a gas supply unit.

Figure 2:
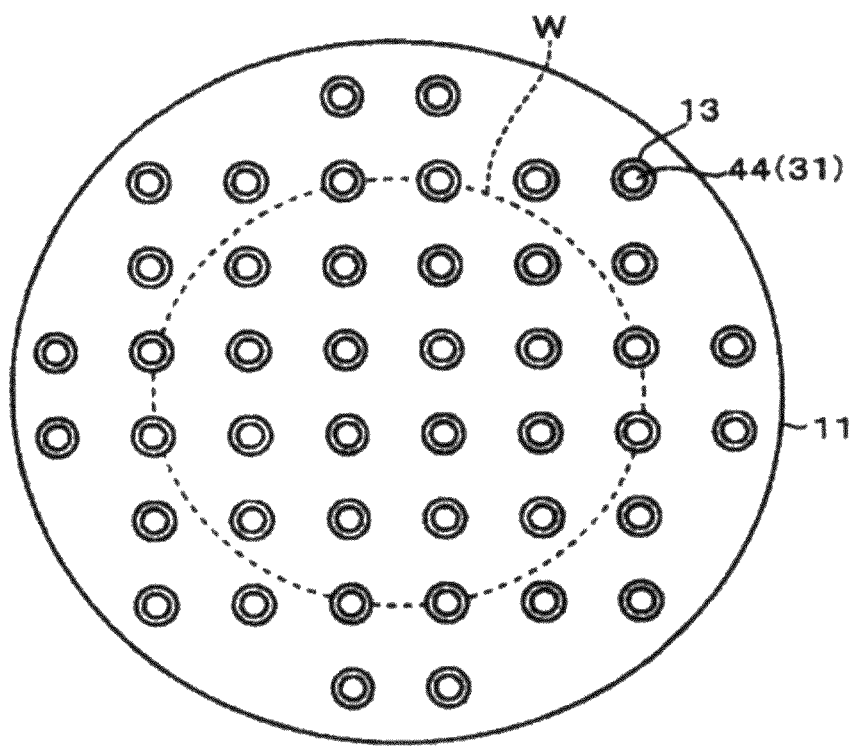
FIG. 2 is a top view illustrating a gas diffusion plate of the substrate processing apparatus.

In FIG. 1, a reference numeral '3' denotes a transfer port of a wafer W which is airtightly sealed by a gate valve G, and a reference numeral '4' denotes a gas exhaust line. The gas exhaust line 4 extends from a gas exhaust port 5 formed at a bottom surface of the processing chamber 1 to a vacuum exhaust unit, e.g., a vacuum pump 7, via a pressure control unit 6. Further, in FIG. 1, a reference numeral '8' represents an electrostatic chuck for electrostatically attracting a wafer W to the mounting table 2 by a voltage supplied from a power supply unit 9 provided outside the processing chamber 1.

In this film forming apparatus, there is provided elevating pins 2a which penetrate through the mounting table 2 in order to transfer a wafer W between the mounting table and an external transfer arm entering the processing chamber 1 via the transfer port 3. In FIG. 1, a reference numeral '2b' indicates an elevation unit for raising and lowering the elevating pins 2a.

Between the ceiling surface of the processing chamber 1 and the mounting table 2, a gas diffusion plate 11 for diffusing a processing gas supplied from the processing gas supply port 21 into the processing chamber 1 is horizontally provided so as to face the wafer W on the mounting table 2. As shown in FIG. 2, the gas diffusion plate 11 is provided with a plurality of gas discharge holes (gas through holes) for injecting the processing gas diffused to a gas diffusion space 12 formed between the ceiling surface of the processing chamber 1 and the gas diffusion plate 11, toward the wafer W.

The gas discharge holes 13 are formed in, e.g., a lattice shape (matrix shape) at regular intervals. Although FIG. 2 schematically shows the gas discharge holes 13, the gas discharge holes 13 are disposed at intervals of, e.g., about 20 mm, in rows and columns. In this example, the ceiling surface and a part of the side surface of the processing chamber 1 and the gas diffusion plate 11 form a gas shower head.

As shown in FIG. 1, a plurality of ceramic heaters 31 as approximately rod-shaped heating structures is airtightly provided at the ceiling surface of the processing chamber 1 and extends vertically from the ceiling surface of the processing chamber 1 toward the gas diffusion plate 11. As shown in FIG. 2, the ceramic heaters 31 are positioned such that a projection area seen when viewing the gas diffusion plate 11 from above is overlapped with the gas discharge holes 13.

Heating units 43 to be described later, i.e., lower end portions (leading end portions) of the ceramic heaters 31, extend from the insides of the gas discharge holes 13 downward to portions below the gas discharge holes 13. In FIG. 2, an outer circumference of the wafer W mounted on the mounting table 2 is indicated by a dotted line.

Figure 3:
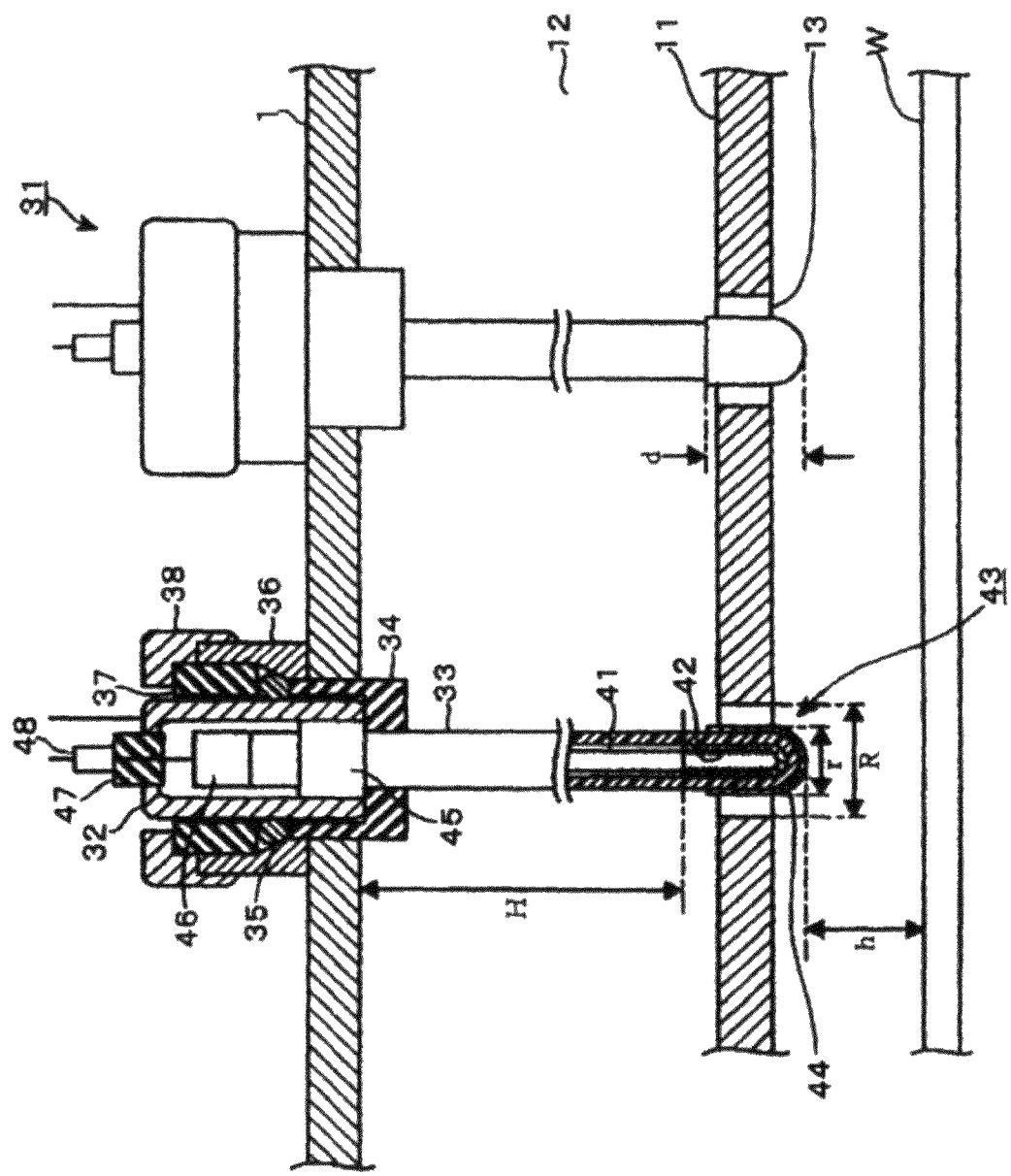
FIG. 3 is an enlarged cross sectional view of a catalyst layer of the substrate processing apparatus.

Referring to FIG. 3, the ceramic heater 31 includes a hollow rod-shaped ceramic line 33 as a ceramic body and a cylindrical housing 32 made of a conductor. The housing 32 covers the upper end portion of the ceramic line 33 with a gap therebetween. The ceramic line 33 is made of, e.g., silicon nitride (SiN) or alumina ($Al_2O_3$) or the like. The ceramic line 33 has a leading end (lower end) that is blocked in a dome shape. Inside the ceramic line 33, a pair of power supply lines 41 is wired from a base end (upper end) in a lengthwise direction.

A resistance heating wire 42 as a resistance heating element is formed at the leading ends of the power supply lines 41. The resistance heating wire 42 is accommodated in a portion corresponding to the leading end (lower end) of the ceramic line 33, and the corresponding portion serves as the heating unit 43 for generating heat by power supplied thereto.

At the upper end of the ceramic line 33 which is covered by the housing 32, a large-diameter connection portion 45 and a small-diameter connection portion 46 are disposed at a lower portion and an upper portion, respectively, while being separated from each other. The outer peripheral surface of the large-diameter connection portion 45 is adhered to the inner peripheral surface of the housing 32. The connection portions 45 and 46 are formed by metalizing a surface of the ceramic line 33, and the power supply lines 41 are connected to the large-diameter connection portion 45 and the small-diameter connection portion 46, respectively.

Hence, one of the power supply lines 41 is electrically connected to the housing 32 forming one electrode unit via the large-diameter connection portion 45. The power supply line 41 extending from the small-diameter connection portion 46 passes through an insulator 47 that blocks an upper opening of the housing 32, and is connected to a screw threaded electrode unit 48 at an upper end thereof. Thus, when a power is applied between one electrode unit (housing) 32 and the other electrode unit 48, the power is supplied to the resistance heating wire 42 via the power supply lines 41. Accordingly, heat is generated from the resistance heating wire 42.

The housing 32 and the electrode unit 48 are connected to a power supply 49 provided outside the processing chamber 1. By supplying the power of, e.g., about 50 W, to the resistance heating wire 42, a metal catalyst layer 44 can be heated to, e.g., about 1000° C. or above. As shown in FIG. 1, the power supply 49 is connected in series to the ceramic heaters 31 via a switching unit 50.

A catalyst is affixed to the area of the outer peripheral surface of the ceramic line 33 which is heated to a preset temperature by the resistance heating wire 42. Specifically, the metal catalyst layer 44 is formed at the outer peripheral surface of the leading end portion of the ceramic line 33. The metal catalyst layer 44 is obtained by processing a catalyst metal, e.g., a refractory metal such as W (tungsten), Ir (iridium), Pt (platinum), Mo (molybdenum), Ru (ruthenium), Pd (palladium), Co (cobalt), Ni (nickel) or the like, using, e.g., a CVD (Chemical Vapor Deposition) method, a sputtering method, a PVD (Physical Vapor Deposition) method, an electroless plating method or the like.

The vertical size of the metal catalyst layer 44 is set such that the upper end and the lower end thereof project upward and downward from the gas diffusion space 11, respectively. Further, the height position of the metal catalyst layer 44 is overlapped with that of the gas diffusion plate 11 in order to maximize contact between the metal catalyst layer 44 and the processing gas flowing from top to bottom through the gas discharge holes 13 surrounding the metal catalyst layer 44. Moreover, due to the presence of the metal catalyst layer 44, the heating unit 43 can serve as the portion which generates heat to a temperature effective for activating the processing gas.

A gap h between the lower end surface of the metal catalyst layer 44 and the surface of the wafer W on the mounting table 2 is set to, e.g., about 1 cm, so that the active species generated by the contact between the processing gas and the metal catalyst layer 44 can be rapidly supplied to the wafer W without being deactivated. A length H from the upper end surface of the ceramic line 33 to the heating unit 43 is set to, e.g., about 5 cm, in order to protect an O-ring 35 made of resin which will be described later from a high temperature by separating the O-ring form the heating unit 43 heated by the resistance heating line 43.

Next, a structure for fixing the ceramic heater 31 to the ceiling portion of the processing chamber 1 will be described. The ceramic heater 31 is supported such that the ceramic line 33 extends downward while penetrating the central portion of an insulating sleeve 34 fixed to the ceiling surface of the processing chamber 1, the insulating sleeve 34 being formed in a cup shape having an upper opening. Further, the ceramic heater 31 is inserted into the insulating sleeve 34 such that the end portion thereof surrounding the lower end portion of the housing 32 in the circumferential direction is supported at an inner circumferential portion of the insulating sleeve 34. Thus, the ceramic heater 31 is supported while being hung from the ceiling surface of the processing chamber 1.

In FIG. 3, a reference numeral '35' denotes a sealing member, e.g., an O-ring, made of an elastic material such as resin or the like which is provided above the insulating sleeve 34 so as to surround the outer peripheral side of the housing 32; a reference numeral '36' denotes a fixing member fixed to a top surface of the processing chamber 1 at an outer peripheral side of the O-ring 35 by, e.g., welding or the like; a reference numeral '37' denotes a ring-shaped pressing member made of an insulator which is provided above the O-ring 35 between the fixing member 36 and the housing 32; and a reference numeral '38' denotes a substantially ring-shaped sealing member for pressing the pressing member 37 downward.

The ceramic line 33 is inserted into the insulating sleeve 34, and the O-ring 35 and the pressing member 37 are stacked above the insulating sleeve 34 in that order between the housing 32 and the fixing member 36. Then, the sealing member 38 is tightened by rotation so that the outer peripheral surface of the fixing member 36 and the inner peripheral surface of the sealing member 38 can be screw-coupled to each other. Accordingly, the pressing member 37 is moved downward and the O-ring 35 is deformed. In this manner, the interior of the processing chamber 1 is airtightly maintained.

This film forming apparatus includes a control unit 60 formed of a computer for controlling an operation of the entire apparatus. The control unit 60 has a CPU, a program, a memory (all not shown) and the like. The program stores therein steps of performing processing to be described later, e.g., film formation, on a wafer W. The program is read out from a storage medium 61 such as a hard disk, a compact disk, a magneto-optical disk, a memory card, a flexible disk or the like and then installed in the control unit 60.

Hereinafter, the operation of the film forming apparatus will be described with reference to FIGS. 4 and 5. First, a wafer W is loaded into the processing chamber 1 via the transfer port 3 by a transfer arm (not shown) and mounted on the mounting table 2 by using the elevating pins 2a. Then, the wafer W is electrostatically attracted to the mounting table 2, and the processing chamber 1 is vacuum-evacuated by fully opening the pressure control unit 6 after airtightly closing the transfer port 3 by the gate valve G.

Next, the switching unit 50 is switched from an off state to an on state, and the power of, e.g., about 50 W, is supplied from the power supply 49 to the ceramic heaters 31. Hence, the resistance heating wire 42 generates heat. The heat thus generated is transferred to the metal catalyst layer 44 via the ceramic line 33, thereby heating the metal catalyst layer 44 to, e.g., about 1000° C. Further, the pressure in the processing chamber 1 is set to, e.g., about 133.33 Pa (about 10 Torr), by controlling the opening degree of the pressure control unit 6.

Then, a processing gas, e.g., silane gas, is injected from the processing gas supply port 21 into the processing chamber 1 at a flow rate of, e.g., about 100 sccm. Here, the structure portion (the housing 32) where the base end side (the upper end side) of the ceramic heater 31 is fixed to the processing chamber 1 is separated from the metal catalyst layer 44 (the heating unit 43) and thus is maintained at a low temperature of, e.g., about 70° C. Since such temperature is lower than or equal to a heat resistance temperature of the O-ring 35, the thermal degradation of the O-ring 35 is suppressed.

Figure 4:
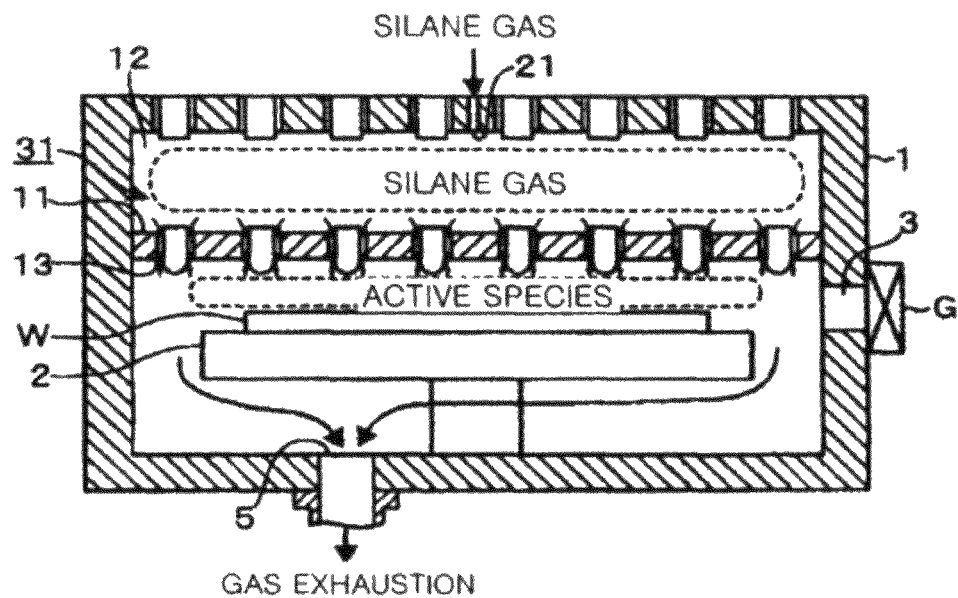
FIG. 4 is a schematic diagram for explaining an operation of the substrate processing apparatus.

As shown in FIG. 4, the processing gas supplied into the processing chamber 1 is diffused in the gas diffusion space 12 between the ceiling surface of the processing chamber 1 and the gas diffusion plate 11, and then is moved downward from the gas discharge holes 13 into which the metal catalyst layers 44 of the ceramic heaters 31 are inserted, while contacting the metal catalyst layer 44. When the processing gas is brought into contact with the metal catalyst layers 44 heated to a high temperature, the silane gas is heated and decomposed by the catalytic action of the metal catalyst layers 44.

Figure 5:
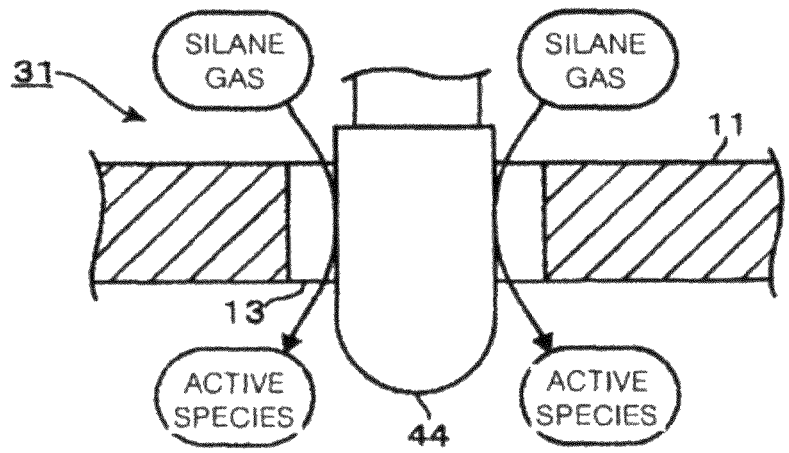
FIG. 5 schematically shows a state where active species are generated in the substrate processing apparatus.

As a consequence, active species such as radicals of H (hydrogen) and film forming species, e.g., active species of Si (silicon) are generated, as shown in FIG. 5. When the film forming species are supplied to the surface of the wafer W, Si is deposited on the wafer W, thereby forming, e.g., a poly-crystalline silicon film.

Unreacted active species, molecular groups produced by deactivation of the active species and unactivated gas molecules are exhausted through the gas exhaust port 5 together with by-products or the like. At this time, since the heating units 43 of the ceramic heaters 31 are positioned inside the gas discharge holes 13 of the gas diffusion plate 11, supply sources of the active species are distributed in accordance with the layout of the gas discharge holes 13 when viewing the gas diffusion plate 11 from the wafer W side.

The active species are supplied from these supply sources to the processing space between the gas diffusion plate 11 and the wafer W and diffused therein. Then, the active species are supplied to the surface of the wafer W while ensuring uniform concentration distribution in the surface of the wafer W, thereby forming a poly-crystalline silicon film having high uniformity in film thickness and film quality. In FIG. 4, the illustration of the ceramic heater 31 is simplified.

In accordance with the above-described embodiment, when a film forming process, for example, is performed on the wafer W by using active species obtained by activating a processing gas by a catalyst, the ceramic heaters 31 in which the catalyst is affixed to the surface of the ceramic line 33 having therein the resistance heating wire 42 are used. Thus, the metal catalyst layers 44 are indirectly heated via the ceramic line 33 without being heated by a current supplied thereto.

Accordingly, it is possible to prevent the power supply unit for heating (the resistance heating wire 42) from being deformed by thermal expansion that occurs in the case of heating a conventional wire-shaped catalyst by supplying a power thereto. As a result, disconnection, short-circuit, or thermal damages caused by the use environment can be avoided.

The ceramic heaters 31 have a rod-shape, and the leading end portions (the lower end portions) thereof serve as the heating units 43 for heating to a temperature effective for activating the processing gas. Therefore, the base end sides thereof (at a side of the ceiling of the processing chamber 1) can be maintained at a lower temperature compared to the heating units 43. For example, the temperature of the base end sides can be lower than the heat resistance temperature of the sealing member made of resin or rubber.

Hence, the sealing member, e.g., the O-ring 35 made of resin, can be used without requiring a particular sealing structure. As a consequence, the ceramic heaters 31 can be airtightly fixed to the processing chamber 1. Besides, since the rod-shaped ceramic heaters 31 are arranged (scattered) in an island shape in the processing chamber 1, the degree of freedom of the arrangement is increased. Thus, the apparatus can be easily designed, and the adjustment thereof can be easily performed even after the fabrication of the apparatus.

Further, the heating units 43 of the ceramic heaters 31 are positioned to correspond to the gas discharge holes 13 of the gas diffusion plate 11, e.g., inside the gas discharge holes 13, so that the processing gas is brought into effective contact with the heating units 43 while passing through the scattered gas discharge holes 13. As a consequence, the processing gas is easily activated by thermal decomposition, and the active species of high concentration are supplied to the wafer W from a plurality of active species sources formed at the surface facing the wafer W. As a result, the film forming process can be realized while ensuring high uniformity in the surface of the wafer W.

Further, the metal catalyst layers 44 are formed in a surface shape at the heating units 43 of the ceramic heaters 31, so that the surface area of the metal catalyst layers 44 that can be disposed in the processing chamber 1 is increased compared to the case of using the conventional wire-shaped catalyst. This leads to the increase of the contact area between the processing gas and the metal catalyst layers 44. Accordingly, the amount of active species generated by activating the processing gas can be increased and a higher film forming speed can be obtained, compared to the case of using the wire-shaped catalyst.

Moreover, even when the metal catalyst layers 44 formed on the surfaces of the ceramic heaters 31 are deteriorated by oxidation or the like, it is possible to regenerate the deteriorated portion by recoating. In addition, the metal catalyst layers 44 are formed on the surfaces of the heating units 43 by using a method for sputtering a metal forming the metal catalyst layer 44 or the like as described above, so that the manufacturing cost is reduced.

Besides, since a plurality of ceramic heaters 31 is provided, it is possible to remove and replace or repair only a ceramic heater 31 having a problem in a metal catalyst layer 44 or the like. Hence, the cost can be reduced compared to the conventional case in which an entire catalyst made of, e.g., a bellows-shaped or net-shaped wire should be replaced when short-circuit occurs, for example.

When the poly-crystalline silicon film is formed, the processing gas is activated by the metal catalyst layer 44 without directly heating the wafer W or using the plasma. Thus, the damages inflicted on the wafer W can be reduced.

In the present embodiment, the ceramic heaters 31 and the gas discharge holes 13 are arranged in a lattice shape. However, the ceramic heaters 31 and the gas discharge holes 13 may be arranged in, e.g., a coaxial shape or a zigzag shape. For example, a larger number of ceramic heaters 31 can be arranged at the peripheral portion of the wafer W than at the central portion of the wafer W. Although the power supply 49 is connected in series to the ceramic heaters 31 in the embodiment, the power supply 49 may be connected in parallel to the ceramic heaters 31. The power supply 49 may be connected in parallel to the ceramic heaters 31 and a power supplied to each of the ceramic heaters 31 may be controlled.

Figure 6:
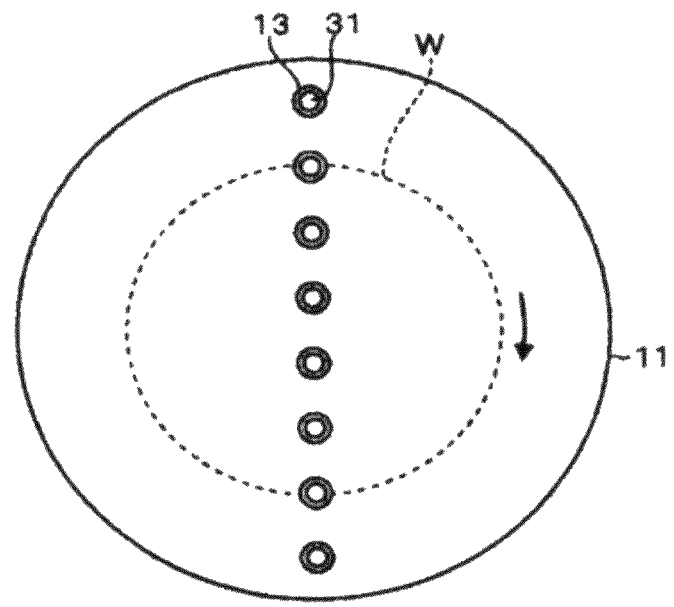
FIG. 6 is a top view showing another example of the gas diffusion plate.
Figure 7:
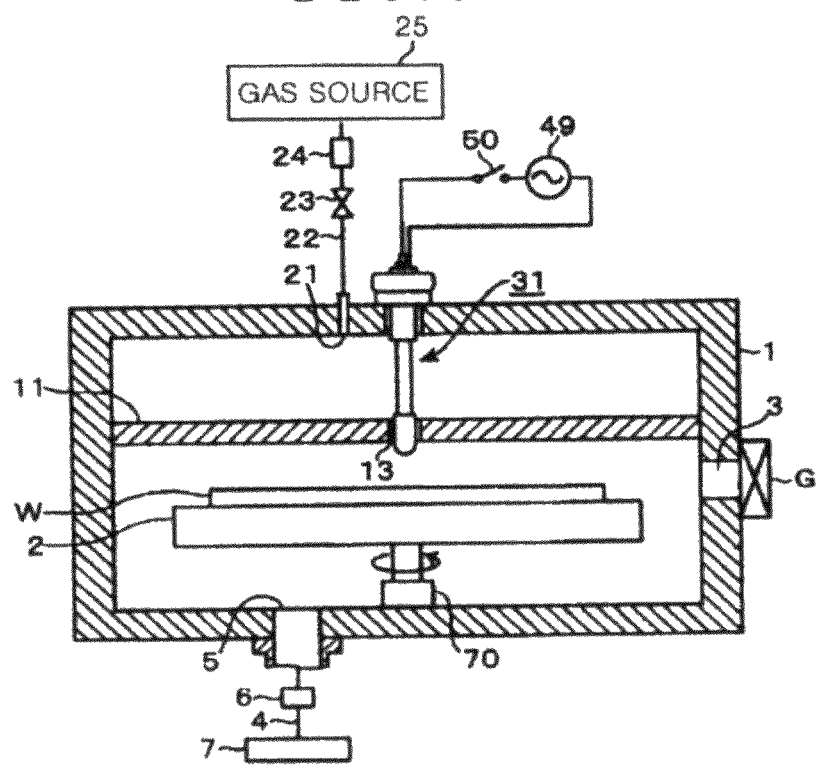
FIG. 7 is a vertical cross sectional view showing another example of the substrate processing apparatus.

As shown in FIG. 6, for example, the ceramic heaters 31 and the gas discharge holes 13 may be arranged in a row at a plurality of locations along the diametrical direction of the wafer W on the mounting table 2. Further, as shown in FIG. 7, a moving unit 70 for rotating the mounting table 2 about a vertical axis may be provided below the mounting table 2 so that the wafer W can be rotated in a circumferential direction during the film forming process. In addition, the moving unit 70 may be provided at the film forming apparatus described above.

Figure 8:
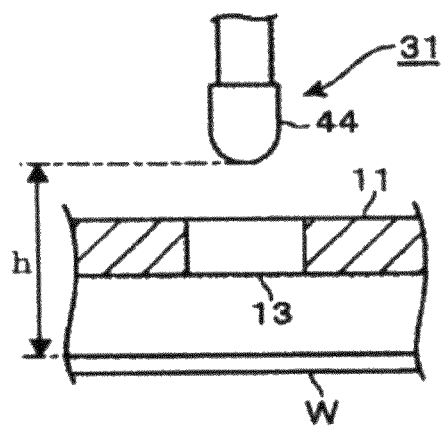
FIG. 8 is an enlarged vertical cross sectional view showing another example of the arrangement of the gas diffusion plate and ceramic heaters.
Figure 9:
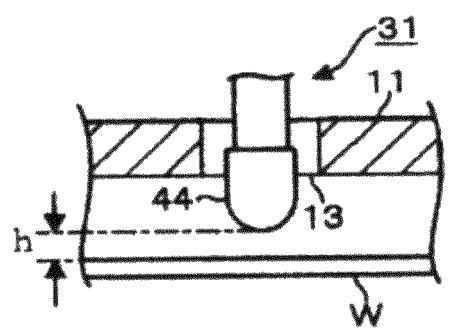
FIG. 9 is an enlarged vertical cross sectional view showing still another example of the arrangement of the gas diffusion plate and the ceramic heaters.

In the above embodiment, the metal catalyst layer 44 is positioned inside the gas discharge hole 13. However, the metal catalyst layer 44 may be upwardly separated from the gas diffusion plate 11 as shown in FIG. 8, or the leading end portion of the ceramic heater 31 may be placed at a further lower portion than that in the above-described embodiment so as to be positioned close to the wafer W. For example, as shown in FIG. 9, only an upper end portion of the metal catalyst layer 44 may be positioned inside the gas discharge holes 13.

Further, the entire heating unit 43 may be placed at a further lower portion than the gas discharge holes 13 so as to face the gas discharge holes 13 (in the projection area of the gas discharge holes 13). Although the ceramic heaters 31 are provided so as to correspond to the gas discharge holes 13 in the above embodiment, the number of the ceramic heaters 31 may be larger than that of the gas discharge holes 13. When the ceramic heaters 31 are separated upward from the gas diffusion plate 11, the number of the gas discharge holes 13 may be smaller than that of the ceramic heaters 31.

The present invention may not be provided with the gas diffusion plate 11. Instead, the rod-shaped ceramic heaters 31 may be vertically provided above the wafer W as in the above-described embodiment, and a plurality of processing gas supply lines 22 may project downward from the ceiling portion of the processing chamber 1 while forming, e.g., a zigzag shape with respect to the arrangement of the ceramic heaters 31 between the ceramic heaters 31. In this case, lower openings (the processing gas supply ports 21) of the processing gas supply lines 22 is positioned above the heating units 43, the processing gas is discharged from the lower openings and decomposed by heating by the heating units 43.

Figure 10:
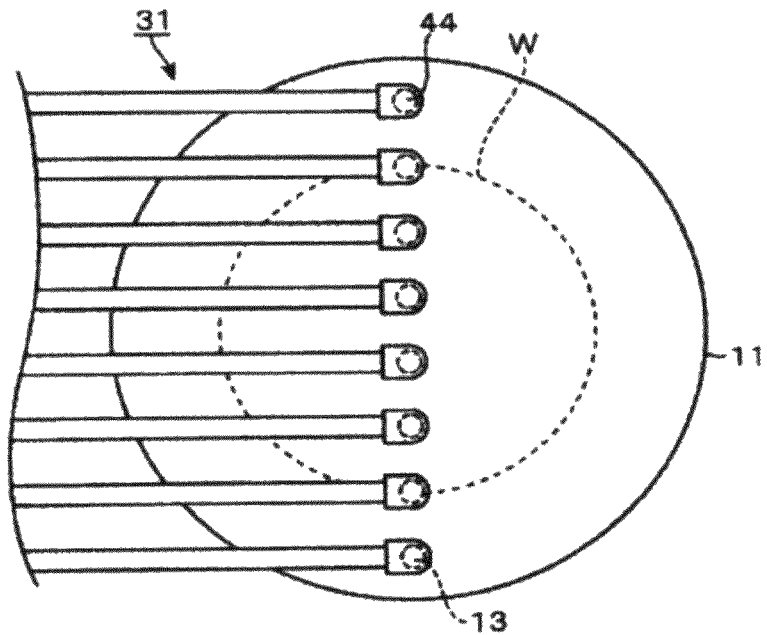
FIG. 10 is a top view showing still another example of the gas diffusion plate and the ceramic heaters.
Figure 11:
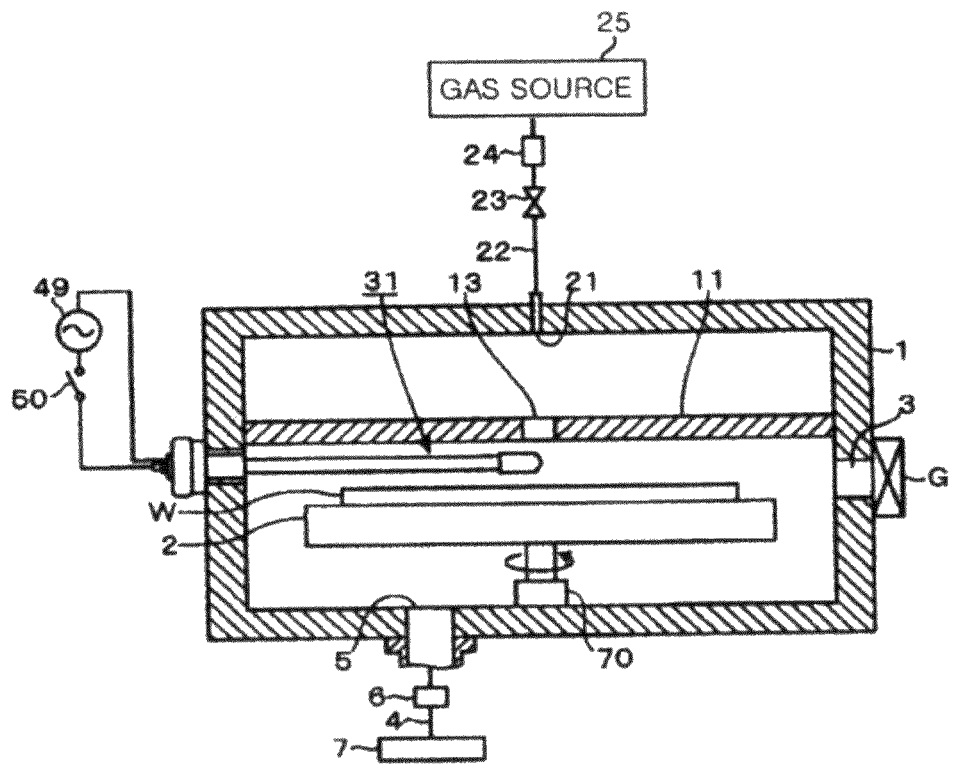
FIG. 11 is a vertical cross sectional view showing still another example of the substrate processing apparatus.
Figure 12:
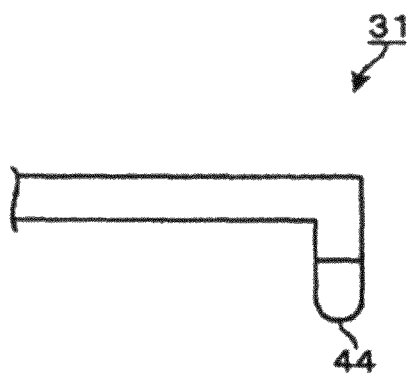
FIG. 12 is a side view showing still another example of the ceramic heater.

When the ceramic heaters 31 and the gas discharge holes 13 are arranged in a row in a diametrical direction of the wafer W and the wafer W is rotated about the vertical axis as shown in FIGS. 6 and 7, the ceramic heaters 31 may be inserted into the processing chamber 2 from the sidewall thereof and positioned below the gas diffusion plate 11 as shown in FIGS. 10 and 11. In that case, as shown in FIG. 12, the leading ends (the heating units 43) of the ceramic heaters 31 may be bent downward in an L shape, for example. Further, the ceramic heaters 31 may be provided above the gas diffusion plate 11.

Further, the above-described processing may be performed on a square-shaped substrate S such as an LCD (Liquid Crystal Display) substrate, a FPD (Flat Panel Display) substrate or the like, instead of a circular wafer W described in the above embodiment. In this case, the ceramic heaters 31 and the gas discharge holes 13 may be arranged in a lattice shape, a coaxial shape, a zigzag shape or the like, as shown in FIGS. 1 and 2.

Figure 13:
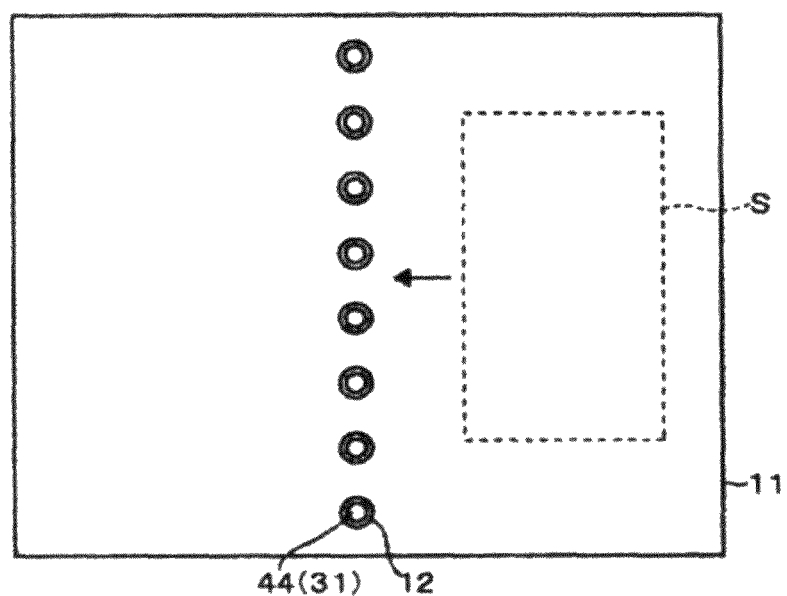
FIG. 13 is a top view showing still another example of the gas diffusion plate and the ceramic heaters.
Figure 14:
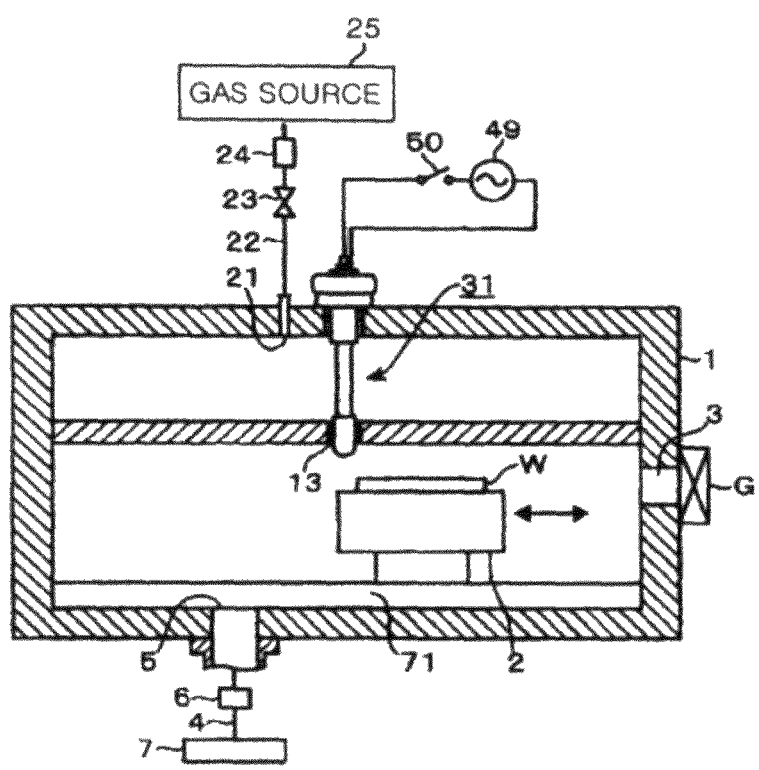
FIG. 14 is a vertical cross sectional view showing still another example of the substrate processing apparatus.

For example, the ceramic heaters 31 and the gas discharge holes 13 may be arranged in a row along one side of the substrate S, as shown in FIGS. 13 and 14. In that case, the mounting table 2 may be provided with a moving unit 71 formed of, e.g., a ball screw and the like, which horizontally transfers the substrate S so that the substrate S passes the area where the active species are discharged downward from the gas discharge holes 13.

In other words, the ceramic heaters 31 (specifically, the heating units 43 corresponding to the leading ends of the ceramic heaters 31) are disposed at a part of the area facing the substrate (the wafer W, the substrate S or the like), and the substrate may be moved such that the entire surface of the substrate is positioned within the area facing the area surrounded by the heating units 43. In other words, a moving unit for horizontally moving the mounting table 2 may be provided to countervail non-uniform supply of active species caused by the arrangement of the heating units 43 to the substrate surface.

In the above embodiment, when the ceramic heaters 31 are repaired (the metal catalyst layers 44 are recoated), the metal catalyst layer 44 made of a metal may be formed by performing a sputtering method or the like using, e.g., a separate sputtering apparatus, after removing the ceramic heaters 31 from the processing chamber 1. Alternatively, the metal catalyst layer 44 may be formed by performing a CVD method in-situ by supplying a processing gas containing a metal forming the metal catalyst layer 44, e.g., $W(Co)_6$, $Ni(PF_3)_4$, $Co_2(Co)_8$, $Ru_3(Co)_{12}$, from the processing gas supply ports 21 in a state where the ceramic heaters 31 are attached to the processing chamber 1 and then decomposing the processing gas on the surfaces of the heating units 43 by heating the heating units 43 by the resistance heating wire 42. Accordingly, a period of time required for replacing (repairing) the ceramic heaters 31 can be reduced. Therefore, the downtime of the apparatus can be shortened.

Figure 15:
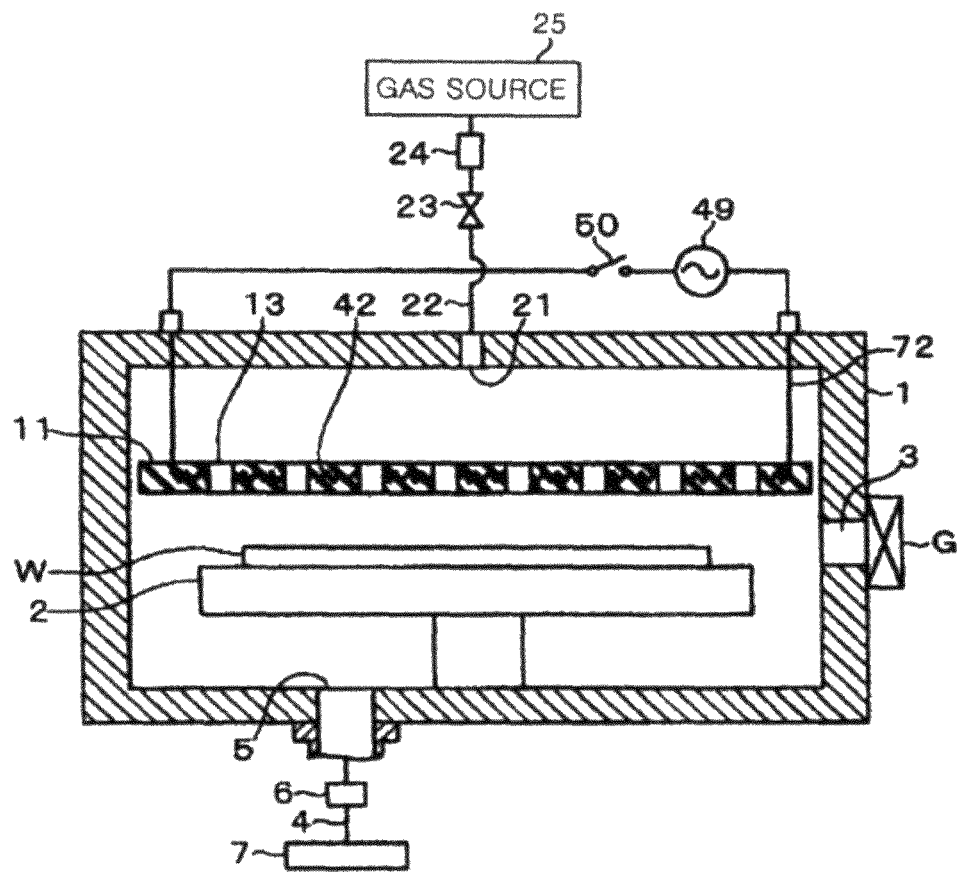
FIG. 15 is a vertical cross sectional view showing still another example of the substrate processing apparatus.
Figure 16:
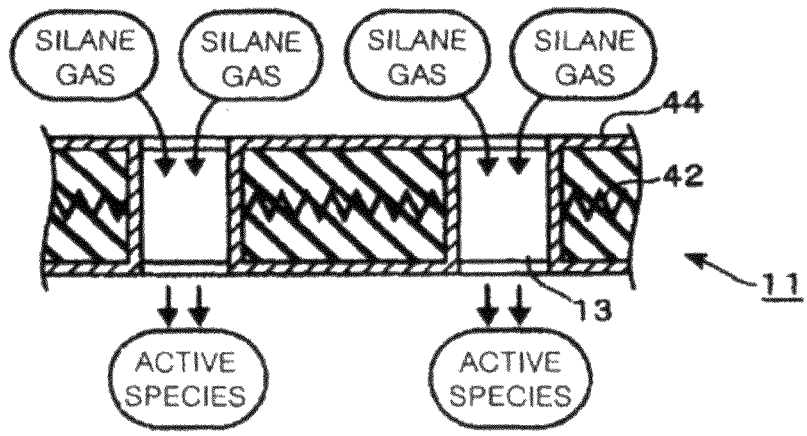
FIG. 16 schematically shows a state where active species are generated in the substrate processing apparatus shown in FIG. 16.

Instead of providing the rod-shaped ceramic heaters 31, it is possible to bury the resistance heating wire 42 horizontally in the gas diffusion plate 11 made of ceramic and form the metal catalyst layer 44 on surfaces of the gas diffusion plate 11 and inner wall surfaces of the gas discharge holes 13, as shown in FIGS. 15 and 16. In that case, the gas diffusion plate 11 is hung by a support unit 72 from the ceiling surface of the processing chamber 1 so as not to be broken by contact with an inner wall of the processing chamber 1 due to thermal expansion thereof. As shown in FIG. 16, the processing gas is activated by contact with the metal catalyst layers 55 formed at the inner walls of the gas discharge holes 13 or at top and bottom surfaces of the gas diffusion plate 11 while passing through the gas discharge holes 13.

The ceramic line 33 (or the gas diffusion plate 11) as a base of the metal catalyst layer 44 may be made of, e.g., pBN (pyrolytic boron nitride) or the like, other than SiN. As for the processing gas, it is possible to use, instead of the silane gas, gases for generating film forming species and active species of H by the metal catalyst layer 44, e.g., a gas such as $H_2$ gas, $NH_3$ gas or the like, and a gas containing Si such as $Si_2H_6$, $SiH_2C_{12}$ or the like.

Thus, $H_2$ gas is activated by the metal catalyst layer 44, thereby generating H radicals. Due to the H radicals thus generated, the gas containing Si is decomposed, thereby generating film forming species. Further, instead of a poly-crystalline silicon film, a W film may be formed by using a gas containing W (tungsten), e.g., $WF_6$ gas, as a gas containing film forming species.

The above-described substrate processing apparatus may perform, other than a film forming process, an oxidation process or a nitriding process on the wafer W or an ashing process on a photoresist film formed on the surface of the wafer W. As for the processing gas used for such processes, $O_2$ (oxygen) gas or $H_2O$ (vapor) gas is used in the oxidation process; $NH_3$ gas or $N_2$ gas is used in the nitriding process;

and NH₃ gas or H₂ gas is used in the ashing process. As for the metal forming the metal catalyst layer 44, a metal that is not easily deteriorated by the processing gases or the active species is properly selected.

What is claimed is:

1. A substrate processing apparatus for processing a substrate using active species obtained by activating a processing gas, comprising:
 a processing chamber, having therein a mounting unit for mounting thereon a substrate, for forming a processing space;
 a gas supply unit which faces the substrate and supplies a processing gas into the processing chamber; and
 a heating structure including a ceramic body disposed in the processing chamber and a resistance heating element disposed in the ceramic body, the ceramic body having a surface to which a catalyst for activating the processing gas is affixed, wherein the catalyst is between the gas supply unit and the substrate.

2. The substrate processing apparatus of claim 1, wherein the heating structure has a rod shape and a leading end portion thereof which faces the processing space serves as a heating unit for generating heat to a temperature effective for activating the processing gas.

3. The substrate processing apparatus of claim 2, wherein a plurality of the heating units are arranged in an island shape when seen from the substrate mounted on the mounting unit.

4. The substrate processing apparatus of claim 2, further comprising: a gas diffusion plate having a plurality of gas through holes, which faces the substrate and partitions the gas supply unit and the processing space in which the substrate is mounted,
 wherein the heating units are arranged to face the gas through holes or positioned inside the gas through holes.

5. The substrate processing apparatus of claim 2, wherein the heating structure penetrates the processing chamber from outside, and a penetrating portion is airtightly sealed.

6. The substrate processing apparatus of claim 2, wherein the heating structure extends vertically and penetrates through a ceiling portion of the processing chamber.

7. The substrate processing apparatus of claim 2, wherein the heating structure extends horizontally and penetrates through the processing chamber.

8. The substrate processing apparatus of claim 1, further comprising: a moving unit which moves the mounting unit horizontally to compensate non-uniform supply of active species to a substrate surface which is caused by the arrangement of the heating units.

9. The substrate processing apparatus of claim 1, further comprising: a gas diffusion plate having a plurality of gas through holes, which faces the substrate and partitions the gas supply unit and the processing space in which the substrate is mounted,
 wherein the heating structure forms at least a part of the gas diffusion plate; and
 a heating unit of the heating structure which generates heat to a temperature effective for activating a processing gas includes a portion surrounding the gas through holes of the gas diffusion plate.

\* \* \* \* \*